United States Patent

Bernardini et al.

[11] Patent Number: 5,950,151
[45] Date of Patent: *Sep. 7, 1999

[54] METHODS FOR IMPLEMENTING NON-UNIFORM FILTERS

[75] Inventors: Riccardo Bernardini, Padua, Italy; Jelena Kovacevic, New York, N.Y.

[73] Assignee: Lucent Technologies Inc., Murray Hill, N.J.

[ * ] Notice: This patent issued on a continued prosecution application filed under 37 CFR 1.53(d), and is subject to the twenty year patent term provisions of 35 U.S.C. 154(a)(2).

[21] Appl. No.: 08/600,557

[22] Filed: Feb. 12, 1996

[51] Int. Cl.$^6$ ........................................... G10L 7/00
[52] U.S. Cl. .......................... 704/200; 704/205; 704/211; 364/724.011
[58] Field of Search ................... 395/2, 2.09, 2.31–2.35, 395/2.42; 341/108; 84/661; 704/200, 201, 205–218, 222–226, 233; 364/724.011, 724.07, 825–827

[56] References Cited

U.S. PATENT DOCUMENTS

| | | | |
|---|---|---|---|
| 5,235,669 | 8/1993 | Ordentlich et al. | 704/200 |
| 5,241,650 | 8/1993 | Gerson et al. | 704/200 |
| 5,432,296 | 7/1995 | Takeuchi et al. | 84/661 |
| 5,432,513 | 7/1995 | Okamoto | 341/108 |
| 5,522,009 | 5/1996 | Laurent | 704/221 |
| 5,632,004 | 5/1997 | Bergstrom | 704/235 |

OTHER PUBLICATIONS

M. Vetterli et al., "Wavelets and Filter Banks: Theory and Design", IEEE Transactions on Signal Processing, vol. 40, No. 9, Sep. 1, 1992, pp. 2207–2232.

A.N. Akansu, "Wavelets and Filter Banks, A Signal Processing Perspective", IEEE Circuits and Devices Magazine, vol. 10, No. 6, Nov. 1, 1994, pp. 14–18.

Nayebi, K. et al. "The wavelet transform and time–varying tiling of the time–frequency plane," Proceedings of the 1992 IEEE–SP International Symposium on Time–Frequency and Time–Scale Analysis, pp. 147–150, Oct. 1992.

Sola, M.A. et al. "Best progressive tiling of the time–frequency plane based on fast time splitting and wavelet transform," Proceedings of the 1994 IEEE–SP International Symposium on Time–Frequency and Time–Scale Analysis, pp. 132–135, Oct. 1994.

Herley, C. et al. "Tilings of the time–frequency plane: construction of arbitrary orthogonal bases and fast tiling algorithms," IEEE Transactions on Signal Processing, v. 41, No. 12, pp. 3341–4459, Dec. 1993.

*Primary Examiner*—Tariq R. Hafiz
*Assistant Examiner*—Jason W. Rhodes

[57] ABSTRACT

Non-uniform filters are designed with a method which utilizes an orthogonal subbanding technique. A tiling representation of a signal is established. The signal is localized for both time and frequency using a mixed tiling representation of the signal. A prototype is then established using the joint time frequency representation of the signal. Lastly, non-uniform filters are developed utilizing the prototype.

25 Claims, 4 Drawing Sheets

METHODS FOR IMPLEMENTING NON-UNIFORM FILTERS

FIELD OF THE INVENTION

The present invention relates to the coding of information. More specifically, the present invention relates to signal coding.

BACKGROUND OF THE INVENTION

Songs played from a record are traditionally represented as analog waveforms. However, in recent times audio signals have been digitized and stored as digital signals. For example, songs stored on a Compact Disc(CD) are kept in digital form. When signals are stored or transmitted in digital form they are usually represented as bits (0's and 1s). A signal such as an audio signal is considered a one-dimensional signal because the signal can be defined by an amplitude at a given time.

The communication systems used to transmit digital signals are very costly. The more bits that need to be transmitted, the longer it may take for the full signal to get to the destination. Therefore different techniques are used to compress the signal so that less bits need to be transmitted which in turn lowers cost and produces real-time signals.

One technique for compressing signals is known as "subband coding." Subband coding utilizes filters to separate the signal into frequency bands. FIG. 1 displays a subband coding system. In FIG. 1, a signal 10 passes through a set of bandpass filters housed in an analysis system 20. The analysis system 20 separates the original signal 10 into subbands. The subbands are then sampled by a sampler 30 at a fast enough rate (i.e., a minimum of twice the number of subbands per unit time) to allow recovery of a sampled version of the information(perfect reconstruction). Once sampled, the subband signals are ready for encoding, transmitting and decoding as denoted by 40. The subband signal is reconstructed by the sampler 50, and then recombined into one signal through a set of filters in a synthesis process 60. The principals of subband coding techniques are described generally in M. Vetterli and J. Kovacevic *Wavelets and Subband Coding*, Prentice Hall, Prentice-Hall, Englewood Cliffs, N.J., 1995.

An analysis system 20 that processes one dimension signals is known as a one-dimensional analysis system. FIG. 2 displays a schematic of the analysis system for a one-dimensional system. The signal 10 is fed into the analysis system 20. The analysis system 20 is composed of bandpass analysis filters 25, which separate the signal into subband signals 27. The signal 10 can be separated into bits where each group of bits represents the magnitude of the audio signal at a point in time. This may be represented as X, where X is composed of x[n] samples where n is unit time. Therefore, x[n] could be a row or column matrix of a sequence of values representing the intensity of each pixel read in serially one at a time. The bandpass analysis filters 25 could be represented as h[n] where H is the total of all the bandpass analysis filters. H would be several row or column matrices (one for each bandpass analysis filter), put together to form a matrix. The subband signals may be represented as y[n], where Y represents all of the subband signals. The matrix multiplication of the input signal(X) denoted by 10, and the bandpass analysis filters(H) denoted by 25, would produce the Subband signals(Y) denoted by 27. Representing the multi-dimensional signal 10 as X, the bandpass analysis filters 25 as H and the subband signals 27 as Y, the analysis system 20 may be represented as $Y = H^T * X$, where $H^T$ is the transpose of H.

The filters H are circuit elements that can be defined mathematically by matrices. An example of a one-dimensional encoding system, the analysis system is defined by H=WG, where W is a windowing matrix and G is a modulation matrix based on a sinusoidal function. FIG. 3 displays a frequency based representation of the set of one-dimensional bandpass filters. The graphs in FIG. 3 are the magnitude Fourier response of the following equation:

$$h_i[n] = w[n] * \cos(f_i[n]),$$

where $h_i[n]$ represents a bandpass analysis filter, w[n] represents the window, and $\cos(f_i[n])$ are the cosine values in the G matrix associated with the filter, where $f_i[n]$ is the impulse response at the time n.

The graph in FIG. 3 is the magnitude frequency response of the filters($h_1$, $h_2$, $h_3$, $h_4$). The filters are plotted as a function of frequency (x axis). The magnitude frequency response of the subband analysis filters $h_1[n]$, $h_2[n]$, $h_3[n]$, and $h_4[n]$, are represented by 100, 110, 120 and 130, respectively. In FIG. 3, each subband filter separates the signal x[n] into a different frequency range. The concept of moving the signal into different frequency ranges is known as modulation. Applying the G matrix to the input signal has the physical effect of shifting the filters along the frequency spectrum by modulating the input signal x[n]. The window W systematically parses through the input signal x[n] so that different portions of the signal x[n] can be modulated. The technique of parsing through the input signal with a window and then modulating the input signal is an efficient way to implement filters because only one prototype filter has to be built and then that prototype filter is applied to different parts of the input signal. The modulation function G modulates the part of the signal x[n] that is in the Window (W) to different parts of the frequency spectrum using the filters 100, 110, 120, and 130 shown in FIG. 3.

There are similarities between designing a digital filter and designing an analog circuit. In designing an analog circuit the circuit designer has to put together the elements of the circuit (i.e. resistors, capacitors, transistors) that perform the desired function of the circuit (i.e. generating voltage, current). The design of digital filters is no different. A filter designer has to put together the combination of components (i.e. adders, subtractors, multipliers, and delay elements) that will perform the desired operation on the signal. Since the circuitry that is used in filters can be expressed as mathematical equations and matrices, the filter designer has to choose the mathematical equations and matrices that will perform the desired function on the signal being processed.

Choosing filter components is like putting together a puzzle. A designer has to choose the components that will produce the desired output signal. Since a filter is defined mathematically by Y=HX, where H is the filter matrix, the values of the matrices that make up H (i.e. W*G), have to be chosen very carefully. In a puzzle each piece has to fit together to produce the picture, in the same way in a filter, each matrix has to fit together to produce the desired output signal.

In filter design, it is often difficult to find simple circuits (matrices), that fit together to produce the required signal. In addition, the difficulty of finding simple circuits that fit together, is increased because the modulation matrix (G) is based on a sinusoidal function (ie. sine, cosine). Since G is based on a sine or cosine, it limits the possible values that the G matrix can have, and since the filter is like a puzzle, the possible values of W are also limited.

All the possible values that a matrix can have are called the search space of the matrix. The larger the search space of the matrix the greater the variety of designs that can be used for the filters. The smaller the search space, the smaller the variety of designs. It would be advantageous to increase the search space, thereby increasing the variety of circuit elements that can be used to implement a filter.

Filters are also characterized by bandwidth when used for the coding of audio information (audio coding). In an analysis system each filter removes the part of the original signal X that falls within the bandwidth of the filter. For example, everything from 0–100 hertz might be removed by the first filter, everything from 100–200 hertz by the second filter and so on. The range of values that a filter can extract (e.g. 0–100 hertz) is considered the bandwidth of the filter. FIG. 4 displays frequency bands extracted by a subband coding scheme. An audio signal 200 is plotted as a function of frequency on the x axis and bandwidth on the y axis. The regions denoted by 210, 220, 230 and 240 represent the bandwidth of the filters $H_1(f)$, $H_2(f)$, $H_3(f)$ and $H_N(f)$, respectively, where f is frequency. Therefore, $H_1(f)$ defined by 210, filters signals in the range from 0–100 hertz, $H_2(f)$ filters signals in the range from 100–200 hertz, $H_3(f)$ filters signals in the range from 200–300 hertz and so on. Most analysis systems normally have filters that have uniform bandwidths. In other words, in FIG. 4, $H_1(f)$, $H_2(f)$, $H_3(f)$ and $H_N(f)$, all have a bandwidth of 100 hertz.

A mixed signal representation has been created known as a tiling. The mixed signal representation displays a signal in terms of both, time and frequency. FIG. 5 shows how the tiling is developed. In FIG. 5 the x-axis represents the time axis, and the y-axis represents a signal f(t). The majority of the energy in the magnitude waveform 201 is centered between 5 and 10 seconds. The y-axis displays a waveform of the Fourier transform 202, of the signal. The majority of the energy in the waveform of the Fourier transform 202 is localized between the values of 100 hz and 200 hz. Therefore the time-frequency tiling would be represented by the block 203. The block 203 shows that the energy of the signal is localized in time between 5 seconds and 10 seconds, and the energy in the frequency domain is localized between 100 hz and 200 hz. Therefore the tiling 203 is a way of displaying both the energy in the time domain and the frequency domain on one graph.

A time-frequency tiling representations of the filters presented in FIG. 4, is given in FIG. 6. The time-frequency tiling plot of FIG. 6 is denoted by time on the x-axis and frequency on the y-axis. The time-frequency tiling is a plot of the amount of signal energy contained in a bandwidth region. In FIG. 6, the areas 210, 220, 230, and 240 correspond to the bandwidth regions 210, 220, 230, and 240 of FIG. 4. When the bandwidth of the filters are nearly uniform, the energy of the signal that is filtered by the bandwidth filters is nearly uniform. This is denoted in FIG. 6 by the equal areas under each region 210, 220, 230, and 240.

The human ear does not hear audio sounds in the same way that communications systems process an audio signal. FIG. 7 gives a graph displaying the bandwidth response for a set of non-uniform filters. The human ear processes audio information in a manner similar to that displayed in FIG. 7 (the way the human ear processes information is called the critical band structure of the human ear). As detailed in FIG. 7, the bandwidth regions are non-uniform, for example the first region 300 has a bandwidth of 100 hertz while the last region 330 has a band width of nearly 5000 hertz. Each of these regions correspond to a filter in a signal processing system (e.g, encoder, decoder).

For the foregoing reasons it would be advantageous to develop non-uniform filters. To accomplish this task filters would have to be developed that have variable bandwidths. Several attempts have been made to design these non-uniform filters. One class of solutions have utilized analytical models to create non-uniform filters J. Kovacevic & Vetterli "Perfect reconstruction filter banks with rational sampling factors", IEEE Transactions on Signal Processing, June 1993. However, they are very difficult to implement. A second class of solutions have tried a numerical approach to designing non-uniform filter design, Nayebi et. al. However they have been found to be computationally intensive. Lastly, a third technique has been proposed by J. Princen, "The design of nonuniform modulated filter banks", submitted to IEEE Transactions on Signal Processing. However this technique does not provide perfect reconstruction of the audio signal after it has been filtered.

SUMMARY OF THE INVENTION

A methodology for implementing non-uniform filters is provided. In the present invention the tiling (time-frequency representation of a set of filters) is determined. For example, from different physiological experiments the critical band structure of the human ear is known, therefore a tiling representation of the critical band structure can be formulated. When the frequency of the critical band structure of the ear is plotted, frequency response of filters that could produce the frequency response of the human critical band structure, would be non-uniform.

The present invention discloses a system that operates with filters that would produce the non uniform frequency response for different applications (e.g. the critical band structure of the human ear). First the time frequency (tiling) representation of the filter bandwith of the application is obtained. Each filter in the tiling representation is analyzed separately. Depending on whether time or frequency is more important, a greater weight factor is applied to either the time component of the tiling, or the frequency component of the tiling. A combined time and frequency representation of the filter is then made. The combined time-frequency representation is localized (where localization uses optimization techniques) for frequency and then for time. The result of the localization step is to produce the most favorable filter given the weighting (tiling representation) of that particular filter. Once the most favorable filter is chosen, the filter can be designed using the technique disclosed in "Coder Using Local Basis in Multidimensions." In other words, if the filter is defined as H, the components of the filter can be discovered using the relationship H=W*K*G, where W is a prototype, K is a reduction element and G is a modulation element which modulates the prototype W.

BRIEF DESCRIPTION OF THE DRAWINGS

The objects, advantages and novel features of the invention will be more fully apparent from the following detailed description when read in connection with the accompanying drawing wherein.

DETAILED DESCRIPTION

Figure 1:
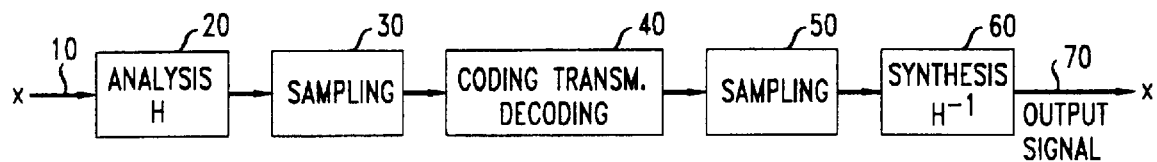
FIG. 1. displays a subband coding system.
Figure 2:
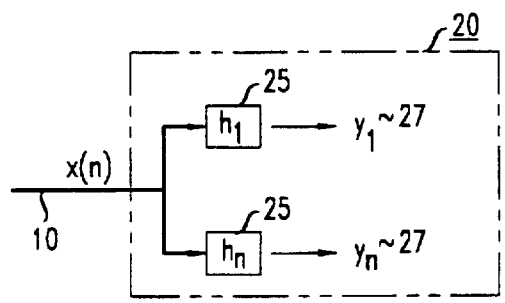
FIG. 2. displays a schematic of an analysis system.
Figure 3:
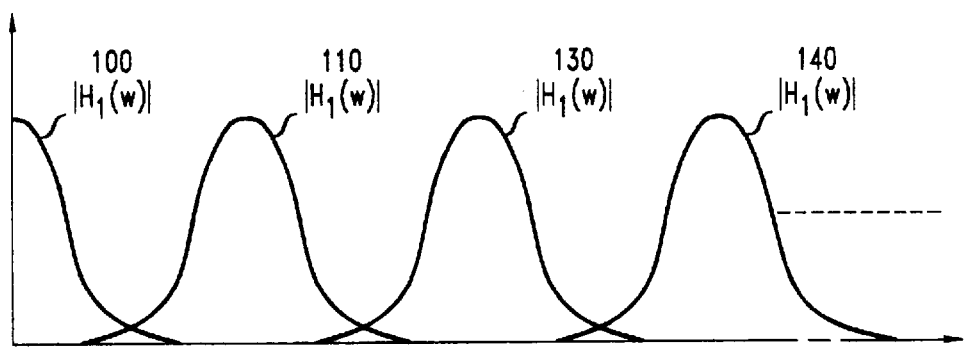
FIG. 3. displays the magnitude frequency response of a set of filters.
Figure 4:
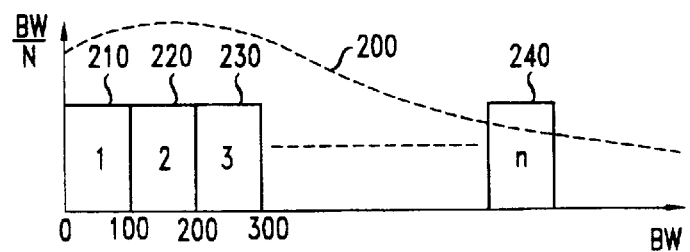
FIG. 4. displays the bandwidth response of a set of uniform filters.
Figure 5:
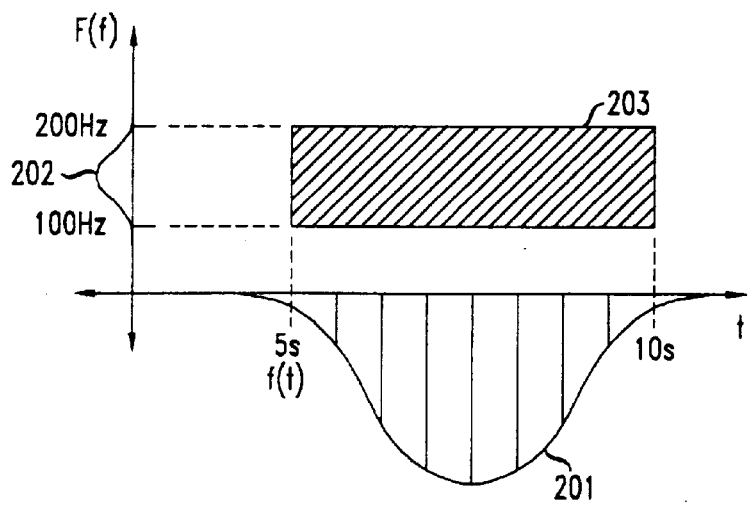
FIG. 5. displays a tiling of a filter.
Figure 6:
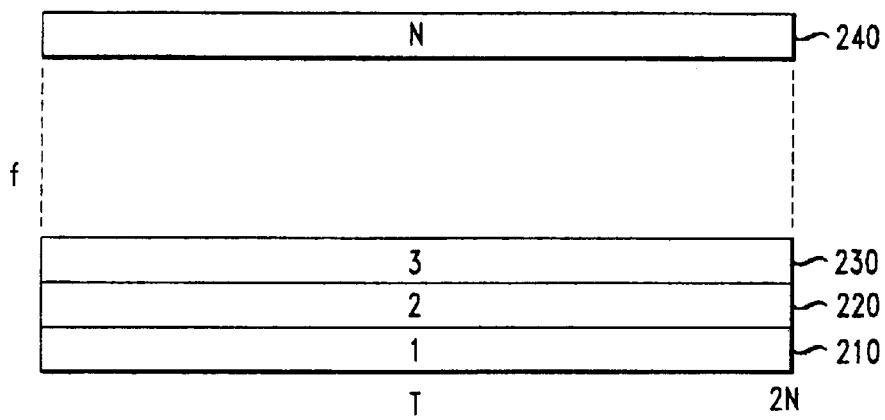
FIG. 6. displays a tiling of a set of uniform filters.
Figure 7:
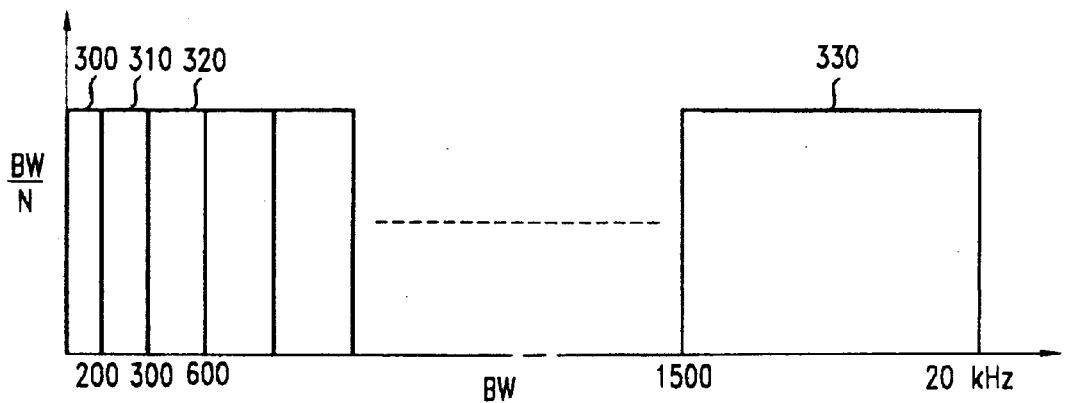
FIG. 7. displays the bandwidth response of a set of non-uniform filters.
Figure 8A:
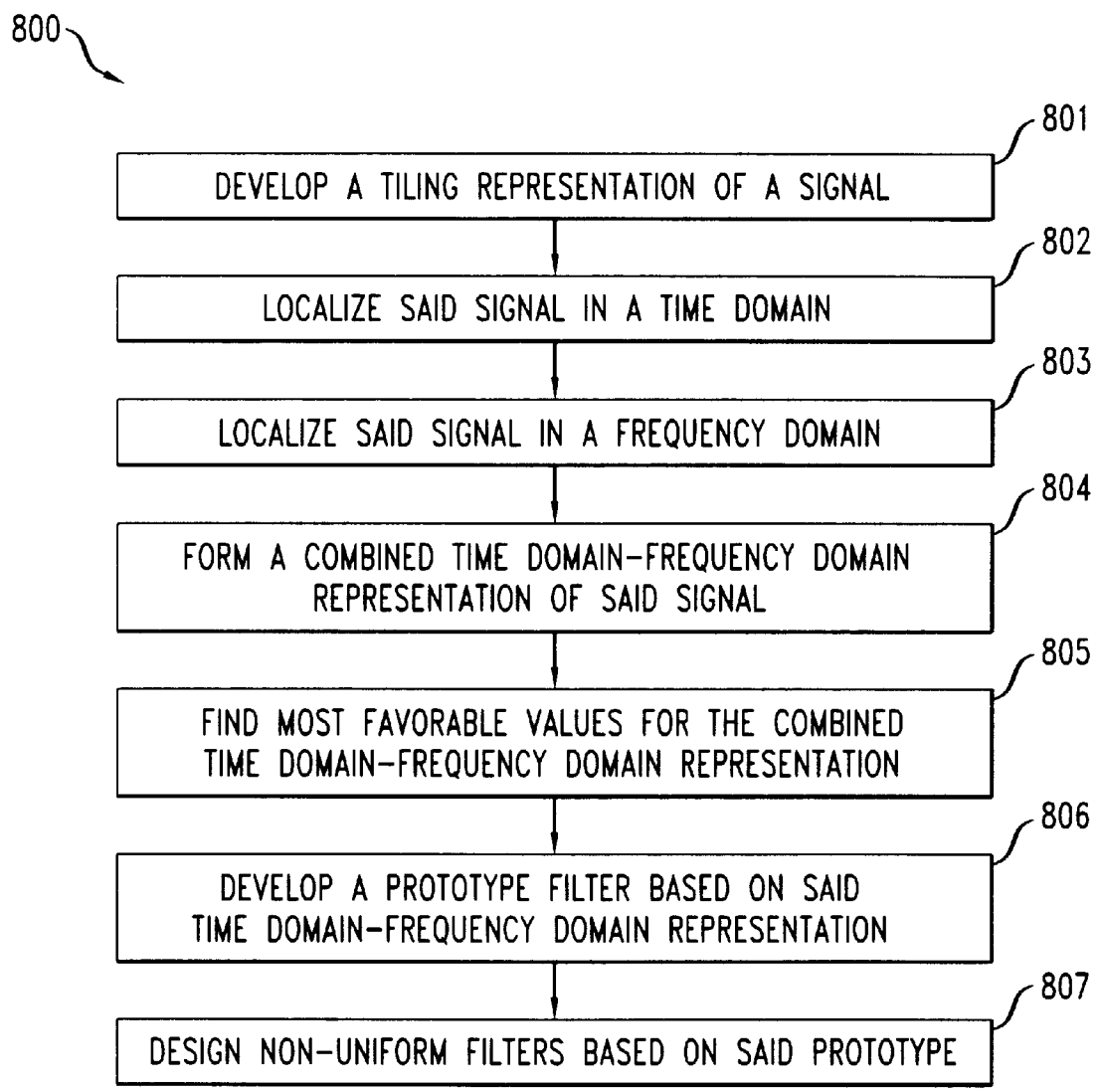
FIG. 8A is a flowchart illustrating a method of implementing a set of non-uniform filters in accordance with the present invention.

The present invention discloses a method 800 of implementing non-uniform filters. The time-frequency tiling for each filter is developed. Once the time-frequency tiling is known, a filter is developed that will produce a frequency-time relationship that corresponds to each tile of the time frequency tiling. Each filter is designed by weighting the filter for time and/or for frequency depending on the location of the tiling that the filter corresponds too. As shown in FIG. 8A, in step 801, a tiling representation of a signal is developed. In step 802, said signal is localized in a time domain. In step 803, said signal is localized in a frequency domain. In step 804, a combined time domain-frequency domain representation of said signal is formed. In step 805, most favorable values for the combined time domain-frequency domain representation are found. In step 806, a prototype filter based on said time domain frequency domain representation is developed. In step 807, non-uniform filters based on said prototype are designed as described in greater detail below. Weighting is preferably performed by forming a cost function to describe the localization in time and frequency. Once individual cost functions in the time and frequency domain are produced a total cost function is developed. The total cost function is then optimized to find the filters. When the localized filter is produced the filter is represented as a matrix where each circuit number in the matrix represents a circuit element. If the filter is defined by the matrix H, the matrix is implemented through the equation H=W*K*G, where W, K, and G are also matrices. The filter that represents a specific tile is then solved by finding the matrix values of W, K and G that will produce the matrix H(where the values of H correspond to circuit elements).

Figure 8B:
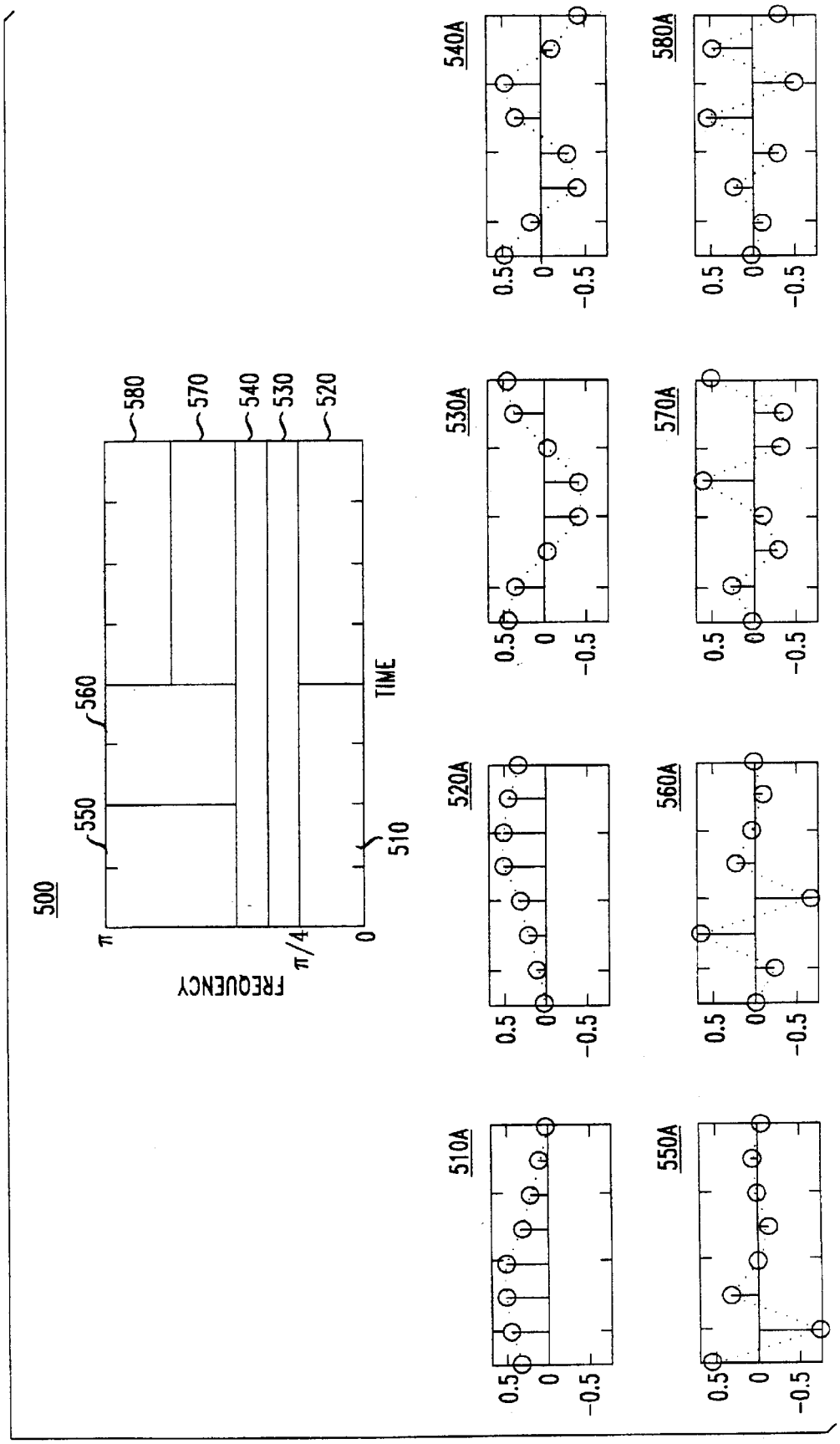
FIG. 8B displays a non-uniform bandpass filter design.

FIG. 8B displays a non-uniform bandpass filter design. A sample tiling is denoted by 500 in FIG. 8B. The tiling plot represents eight bandwidth filters where the tiling for each filter is represented by the areas 510, 520, 530, 540, 550, 560, 570, and 580. The vertical axis is the frequency axis and has a maximum value of $\pi(3.1416...)$. The horizontal axis is time. The eight impulse response plots 510a through 580a correspond to the eight tiling plots denoted by 510 through 580. So for example, plot 510 and impulse graph 510a are the graphs of the same filter (e.g. $h_{510}$).

In the present invention the sample tiling 500 could be developed as detailed below. The objective of the present invention would be to design a set of non-uniform filters that would have a tiling equal to the sample tiling 500. In other words the present invention discloses a method of implementing eight filters (corresponding to the eight regions in the sample tiling) that would have tiling representations that correspond to the eight tiling regions 510, 520, 530, 540, 550, 560, 570 and 580, respectively. The graphs of the impulse response 510a, 520a, 530a, 540a, 550a, 560a, 570a, and 580a, will be used in the present disclosure to display how each of the filters have to be weighted in time and frequency, to produce the components of the sample tiling 500.

If the first plot 510 and the first impulse response graph 510a are analyzed, 510a has its higher values (values closer to 0.5) in the first portion of the graph. In addition, 510a does not have a high frequency (the values do not change above and below the zero axis). Therefore, 510 is of a low frequency and most of its energy is in the first portion of the time period. The tiling 510 is plotted to display the frequency and energy of 510a, the tiling 510 has a low frequency energy and most of its energy is plotted in the first portion of the time period relative to the other tiling areas. The filter that corresponds to 510, would be a filter that has a low frequency and has most of its bandwidth signal energy in the early portion of the tiling time period, relative to the other filters. Therefore utilizing the present methodology, the filter that corresponds to region 510 would have a low weighting in both time and frequency.

Each tiling region corresponds to a filter and could be analyzed in the same way as region 510. For example, the impulse response graph 520a has a low frequency and most of its energy is in the second half of the time period. In the second tiling plot 520, the tiling is plotted at the bottom of the frequency spectrum and is positioned at the second portion of the time period. The third impulse response plot 530a has a higher frequency than the first and second impulse response plots (510a and 520a, respectively), however its energy is almost uniformly distributed over the full time period of the graph. The uniform energy distribution is denoted by the fact that all the points are distributed above and below zero. Therefore the third tiling plot 530 is plotted above the first and second tiling plots (510 and 520, respectively), because the third plot 530 has a higher frequency than the first two plots. The filter for region 530 would be weighted so that its frequency would be higher than regions 510 and 520, the filter for region 530 would have signal response energy that extends over the entire time period. As a final example the seventh plot 570 will be discussed. The seventh impulse response graph 570a has a high frequency because the values change above and below the zero line often. Most of the energy in the seventh impulse response graph 570a is located in the second portion of the time period because the values plotted in the second portion of the seventh impulse response graph 570a are farther apart from the zero axis then the values plotted in the first portion of the seventh impulse response graph 570. The tiling 570 of the seventh impulse response graph 570a is therefore, higher in frequency than the plots of 510, 520, 530, 540 and positioned in the second portion of the time period.

Once the desired tilling are known, a filter is designed that will produce each of the tiling areas. In other words, a filter is designed that will manipulate the signal so that tiling 510 of FIG. 8B will be produced, where the signal has a low frequency and is in the earlier period in time. The filters are designed by first localizing the signal for time and then localizing the signal for frequency. It should be noted that time and frequency have an inversely proportional relationship. Therefore, the frequency and time components have to be weighted, so that the inverse relationship of time and frequency will be accounted for. In order to account for the inverse relationship and to design filters that reproduce the sample tiling displayed in FIG. 8B, optimization of a combined time and frequency representation is performed.

Considering FIG. 8B, region 510 is located between 0 and $\pi/4$. Using the methodology disclosed in the instant application a filter should be designed that has frequency localization between 0 and $\pi/4$. In order to express the localization in frequency, the fourier transform of the signal/filter h could be written as follows:

$$H(w) = \sum_{n=0}^{N-1} h[n]\exp(-jwn) \quad (1)$$

where H(w) is the Fourier Transform of the signal h, w is the frequency and n is the time index. Equation (1) can be written in vectorial form $$H(w)=W^T(w)h \quad (2)$$

where $W^T$ (w) is a column vector containing functions exp(-jwn) organized so that the functions are compatible with the ordering of the samples h. Note that the transpose symbol $^T$ will be used when the vector is complex.

Frequency localization of region 510 would be obtained by maximizing the power in the frequency interval between 0 and π/4 or minimizing the power in the frequency interval between π/4 and π The power of H at a given frequency w can be expressed as:

$$H^T(w)H(w)=h^T W(w)W^T(w)h, \quad (3)$$

The power of H in the region 510 is expressed as:

$$P_F = \int_{w \in A_F} h^T W(w)W^T(w)h\, dw = h^T (\int_{w \in A_F} W(w)W^T(w)\, dw)h \quad (4)$$

Ultimately, the power of the frequency($P_F$) in the tiling region 510 can be expressed as $$P_F = h^T C_F h, \quad (5)$$

where h is the signal, $h^T$ is the transpose of the signal and $C_F$ is the cost function or weight associated with this first tiling region 510. The cost function $C_F$ weights down the signal h in the region between 0 and π/4, therefore the cost function $C_F$ positions the tiling between the values of 0 and π/4 in frequency.

A more general form of equation (4) can be useful. Equation (4) can be replaced with:

$$P_F = \int e(w)W(w)W^T(w)\, dw \quad (6)$$

where the integral is extended to the whole frequency space of FIG. 8B and e(w) is a weight function. Equation (4) can be written as equation (6) with e(w)=$\chi_{A_F}$, where $\chi_{A_F}$ is the characteristic function of $A_F$. Since the frequency power distribution is symmetric with respect to the origin, it is reasonable to assume that e(w) is symmetric as well.

A similar process is applied to the tiling region 510 to produce the time localization. Tiling region 510 of FIG. 8B can be localized for time between 0 and 5. Equation (7) could be used to express this relationship;

$$\sum_{n=0}^{4} h^2[n]. \quad (7)$$

In order to use equation (7) with the frequency cost function of equation (5), it would be useful to express equation (7) in matrix form:

$$h^T \begin{bmatrix} I_4 & \\ & 0_4 \end{bmatrix} h \quad (8)$$

where $I_4$ and $O_4$ are the identity and null matrix, respectively. Both matrices are 4×4 matrices. In general the time localization could be expressed in a manner similar to equation (4), as $$\sum e(n)h^2[n] \quad (9)$$

where e is a weight function similar to e in equation (6). Rewriting (9), (10) results.

$$h^T C^T h \quad (10)$$

where $C^T$ is a diagonal matrix formed with the values of e. In equation (10) time localization can be expressed as $h^T C_T h$, where h is the signal, $h^T$ is the transpose of the signal and $C^T$ is the cost function associated with time. Therefore a filter that produces the tiling region 510 would be defined by a frequency cost function $h^T C_F h$ and a time cost function $h^T C_T h$.

A joint time frequency localization can then be expressed as $$h^T(C^F+C^T)h=h^T Ch, \quad (11)$$

which is a quadratic cost function, that defines the cost of the tiling region 510 both in terms of frequency and time. For each filter $h_{510}, \ldots, h_{580}$, the total cost function can be written as:

$$C_i(h_i)=h_i^T C_i h_i, \quad (12)$$

where $h_i$ is the filter and $C_i$ is the total cost. The cost function corresponding to all of the filters $h_{510}, \ldots, h_{580}$ is given by:

$$\sum_{i=510}^{580} h_i^T C_i h_i \quad (13)$$

herefore, the filters that produces a tiling equal to region 510, . . . ,580 can be obtained by maximizing equation (13) to solve for $h_i$. The solution of the optimization procedure would be a matrix that represent all the filter $h_{510}, \ldots, h_{580}$, where $h_{510}, \ldots, h_{580}$ are filters that produce the tiling regions 510 through 580. Each row of the matrix would represent one of the filters (510, . . . ,580), and each value in the matrix would correspond to a circuit element that implements one of the filters.

To facilitate the implementation of the filters, the filters have satisfy constraints imposed by the technique disclosed in R. Bemardini and J. Kovacevic, "Local orthogonal bases I: Construction," *Multidim. Syst. and Sign. Proc., special issue on Wavelets and Multiresolution Signal Processing*, July 1996. Invited paper. R. Bemardini and J. Kovacevic, "Local orthogonal bases II: Window design," *Multidim. Syst. and Sign. Proc., special issue on Wavelets and Multiresolution Signal Processing*, July 1996. Invited paper. In the disclosed technique a window (W) is applied to a multi-dimensional signal. The window moves through the multi-dimensional signal, taking one group of samples at a time. The circuit implementation of the sampler (W) is a low pass filter. The matrix representation of the sampler (W) is a matrix that has very small variation in the magnitude of the numbers along the diagonal of the matrix. A reduction process (K) is then applied to the multi-dimensional signal. The reduction function exploits symmetry in the signal to reduce complexity of the circuitry required to implement the filters used in processing the signal. Both the sampler W, and the reduction circuit (K) are defined by the application that the filter is being used for. As an example, in the case of the reduction circuit(K), if the application is an image in which the upper left quadrant of the image and the lower right quadrant of the image are the same, the reduction circuit could be designed to erase one of these areas and reconstruct the missing portion in the synthesis portion of the circuit. When the reduction circuit is represented as a matrix, the reductions are noticeable because the reduction matrix (K) is smaller than the sampler matrix (W). Lastly, modulation is performed with a basis function (G). The circuit that implements the modulation function utilizes the sampler (W), by repeatedly using the sampler to process portions of the signal x[n].

The criterion for the modulation circuit (G) is that there is a circuit design that can reverse the modulation performed by G, so that the input signal X can be reconstructed. If the modulation circuit (G) is implemented as a matrix, this would mean that $G^{-1}*G=I$, Where $G^{-1}$ is the inverse of G and I is the identity matrix. Physically, in a circuit implementation of the modulation function, a reverse circuit $G^{-1}$ would be a circuit placed in the synthesis portion of the decoding system, to reconstruct the signal modulated by G. When the search space of G is based on a sinusoidal functions (sine, cosine), it limits the amount of inverse circuits that are available. However, the use of non-sinusoidal functions are disclosed for G, thereby increasing the search space of invertible circuits, because by using non-sinusoidal functions, there is a much greater number of waveforms that G can be based upon. A complete discussion of the Local Orthogonal basis is defined in application Ser. No. 08/545,077 entitled "Coder Using Local Basis in Multidimensions", filed Oct. 19, 1995, which is hereinafter incorporated by reference and commonly owned and assigned to AT&T Corp.

The values used to represent the filter can be determined by finding a basis using a closed form solution, an iterative solution or an analytical solution. The method of using each of these specific solutions is disclosed in *Arbitrary Tilings of the Time-Frequency Plane Using Local Bases*, R Bemardini and J. Kovacevic, Oct. 12, 1995, pages 7–9, which is incorporated by reference in its entirety.

While several embodiments of the invention are disclosed and described, it should be appreciated that various modifications may be made without departing from the spirit of the invention or the scope of the subjoined claims.

The invention claimed is:

1. A method of designing non-uniform filters that produce a non-uniform frequency response adapted to a predetermined application, the method comprising the steps of:

developing a tiling representation of a signal, processing said signal to localize it in a time domain, processing said signal to localize it in a frequency domain, forming a combined time domain-frequency domain representation of said signal, computing most favorable values for the combined time domain-frequency domain representation, developing a prototype filter based on said time domain-frequency domain representation, and designing non-uniform filters based on said prototype whereby said non-uniform filters reproduce the tiling.

2. A method as claimed in claim 1 wherein said signal is localized in the time domain by adding a cost associated with regions in said time domain.

3. A method as claimed in claim 1 wherein said signal is localized in the frequency domain by adding a cost associated with regions in said frequency domain.

4. A method as claimed in claim 1 wherein said signal is localized in both the time and frequency domain by adding a combined weight to the signal.

5. A method as claimed in claim 1 wherein a non-orthogonal method of designing filters is applied.

6. A method as claimed in claim 1 wherein said signal is an audio signal.

7. A method as claimed in claim 1 wherein said signal is localized for frequency using the form $h^T C_F h$.

8. A method as claimed in claim 1 wherein said signal is localized for time using the form $h^T C_T h$.

9. Method as claimed in claim 1 wherein said signal has a combined time domain frequency domain representation in the form $h^T(C^F+C^T)h=h^T Ch$.

10. A method as claimed in claim 1 wherein said most favorable value for the combined time domain frequency domain representation is found using an iterative method.

11. A method as claimed in claim 1 wherein said most favorable value for the combined time domain frequency domain representation is found using an analytical method.

12. A method as claimed in claim 1 wherein said most favorable value for the combined time domain frequency domain representation is found using a computational method.

13. A method of designing non-uniform filters that produce a non-uniform frequency response adapted to a predetermined application, the method comprising the steps of:

developing a tiling representation of a signal, processing said signal to localize it in a time domain, processing said signal to localize it in a frequency domain, forming a combined time domain-frequency domain representation of said signal, computing most favorable values for the combined time domain-frequency domain representation, developing a prototype filter based on said time domain-frequency domain representation, and physically implementing non-uniform filters based on said prototype whereby said non-uniform filters reproduce the tiling.

14. A method as claimed in claim 13 wherein said signal is localized in the time domain by adding a cost associated with regions in said time domain.

15. A method as claimed in claim 13 wherein said signal is localized in the frequency domain by adding a cost associated with regions in said frequency domain.

16. A method as claimed in claim 13 wherein said signal is localized in both the time and frequency domain by adding a combined weight to the signal.

17. A method as claimed in claim 13 wherein a non-orthogonal method of designing filters is applied.

18. A method as claimed in claim 13 wherein said signal is an audio signal.

19. A method as claimed in claim 13 wherein said signal is localized for frequency using the form $h^T C_F h$.

20. A method as claimed in claim 13 wherein said signal is localized for time using the form $h^T C_T h$.

21. A method as claimed in claim 13 wherein said signal has a combined time domain frequency domain representation in the form $h^T(C^F+C^T)=h^T Ch$.

22. A method as claimed in claim 13 wherein said most favorable value for the combined time domain frequency domain representation is found using an iterative method.

23. A method as claimed in claim 13 wherein said most favorable value for the combined time domain frequency domain representation is found using an analytical method.

24. A method as claimed in claim 13 wherein said most favorable value for the combined time domain frequency domain representation is found using a computational method.

25. A method of designing non-uniform filters that produce a non-uniform frequency response adapted to a predetermined application, the method comprising the steps of:

sampling a signal representative of a physical event, developing a tiling representation of the signal, processing said signal to localize it in a time domain, processing said signal to localize it in a frequency domain, forming a combined time domain-frequency domain representation of said signal, computing most favorable values for the combined time domain-frequency domain representation, developing a prototype filter based on said time domain-frequency domain representation, and designing non-uniform filters based on said prototype whereby said non-uniform filters reproduce the tiling.

* * * * *